US008422008B2

(12) United States Patent
Xia et al.

(10) Patent No.: US 8,422,008 B2
(45) Date of Patent: Apr. 16, 2013

(54) ELECTRICAL MACHINE COMPONENT MONITORING SYSTEM AND METHOD

(75) Inventors: Hua Xia, Altamont, NY (US); Glen Peter Koste, Niskayuna, NY (US); Axel Busboom, Unterleinleiter (DE); Christopher Anthony Kaminski, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 233 days.

(21) Appl. No.: 12/893,115

(22) Filed: Sep. 29, 2010

(65) Prior Publication Data

US 2012/0075633 A1 Mar. 29, 2012

(51) Int. Cl.
*G01N 21/00* (2006.01)

(52) U.S. Cl.
USPC ..................................... 356/237.1; 356/237.2

(58) Field of Classification Search ..... 356/237.1–237.5
See application file for complete search history.

(56) References Cited

U.S. PATENT DOCUMENTS

| | | | |
|---|---|---|---|
| 4,254,331 A | 3/1981 | Dorman et al. | |
| 4,328,008 A | 5/1982 | Muenger et al. | |
| 6,004,379 A | 12/1999 | Wallace et al. | |
| 6,204,915 B1 * | 3/2001 | Persegol et al. | 356/73.1 |
| 6,850,328 B1 * | 2/2005 | Leirfall | 356/432 |
| 8,076,909 B2 * | 12/2011 | Diatzikis et al. | 322/99 |
| 2008/0247702 A1 | 10/2008 | Thompson et al. | |
| 2008/0277266 A1 | 11/2008 | Layman et al. | |
| 2010/0066315 A1 | 3/2010 | Diatzikis et al. | |

FOREIGN PATENT DOCUMENTS

| | | |
|---|---|---|
| CN | 102042843 A | 5/2011 |
| GB | 2458208 A | 9/2009 |
| GB | 2479263 A | 10/2011 |
| WO | 9525271 A1 | 9/1995 |

OTHER PUBLICATIONS

Search Report from corresponding GB Application No. GB1116616.2 dated Feb. 1, 2012.

* cited by examiner

*Primary Examiner* — Michael P Stafira
(74) *Attorney, Agent, or Firm* — Ann M. Agosti

(57) ABSTRACT

An electrical machine component monitoring system includes a light source that provides an optical signal through a fiber optic cable and a fiber optic sensing component positioned on the electrical machine component or at a standoff distance from the electrical machine component to obtain a responsive optical signal representative of a condition of the electrical machine component. The system further includes a photodetector to receive the responsive optical signal from the fiber optic sensing component and to convert the responsive optical signal to an electrical signal. A processing circuitry is also provided in the system for determining information regarding dirt on the electrical machine component by analyzing the electrical signal.

23 Claims, 8 Drawing Sheets

ELECTRICAL MACHINE COMPONENT MONITORING SYSTEM AND METHOD

BACKGROUND

The invention relates generally to a system and a method for monitoring electrical machine component integrity and more specifically to a fiber optic based system and method for monitoring end winding components of a rotating machine.

Rotating machines such as electric generators driven by steam turbines or gas turbines have the capacity to carry several thousand amperes of current in their stator windings. Stator windings generally comprise conductive bars secured in corresponding slots in a stator core and end windings extending beyond the stator core for making connections between the conductive bars. End-winding components are subject to electro-dynamic and mechanical forces that induce a displacement of the end windings.

Loosened end winding components rub against each other due to electromagnetic forces that cause wearing of the winding insulation material. Thus, dusts such as glass, mica, resin, and paint may accumulate on the end winding components and may mix with generator oil to form grease near the end windings and other end winding components. The grease normally has varied color from brown to dark, determined by mixing ratio of the dust and generator oil mists. In some circumstances, unplanned outages of generators are needed to clean the end windings, or to replace the damaged insulation protection layer on end windings. The unplanned outages reduce the power system availability and increase unnecessary maintenance cost.

Generator end winding loosening is primarily diagnosed by visual inspection for the presence of dust. However, visual inspection requires the generator to be taken out of service. An alternative inspection method includes monitoring overall end winding motion, typically by using fiber coupled accelerometers placed in a number of locations on the end winding. Fiber coupled accelerometers, however, do not provide dust monitoring functionality and must be positioned at a number of locations (typically 6). Another potential inspection method is based on a camera imaging method, but it is difficult to access all the end winding locations.

Therefore, there is a need for an improved electrical machine component monitoring system to address one or more of the aforementioned issues.

BRIEF DESCRIPTION

In accordance with an embodiment of the present invention, an electrical machine component monitoring system is provided. The system includes a light source for providing an optical signal through a fiber optic cable and a fiber optic sensing component positioned on the electrical machine component or at a standoff distance from the electrical machine component for obtaining a responsive optical signal representative of a condition of the electrical machine component. A photodetector is provided in the system for receiving the responsive optical signal from the fiber optic sensing component and converting the responsive optical signal to an electrical signal. The system also includes a processing circuitry for determining information regarding dirt on the electrical machine component by analyzing the electrical signal.

In accordance with another embodiment of the present invention, a method for an electrical machine component monitoring is provided. The method includes providing an optical signal onto the electrical machine and measuring a reflected optical signal from a fiber optic sensing component positioned on the electrical machine component or at a standoff distance from the electrical machine component. The method also includes determining information regarding dirt on the electrical machine component by analyzing the reflected optical signal.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Figure 1:
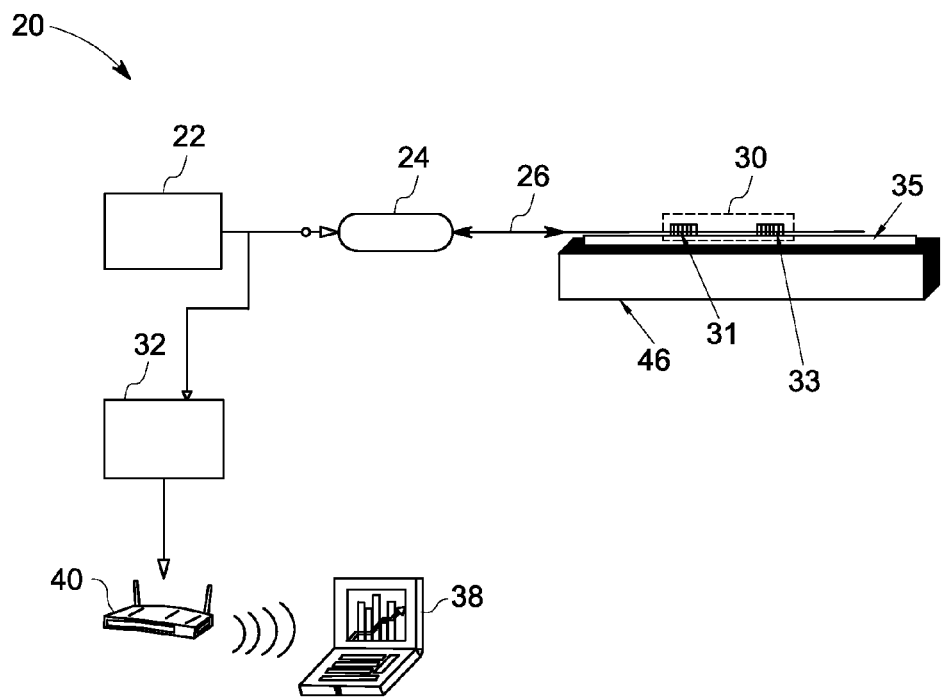
FIG. 1 is a schematic view of a fiber optic wavelength multiplexing method based end winding integrity monitoring system in accordance with an embodiment of the present invention.

FIG. 1 is a schematic illustration of an end winding component monitoring system 20 according to an embodiment of the invention. In general, monitoring system 20 includes a light source 22, such as a tunable or broadband light source, in light communication with an optical coupler or circulator 24. Optical coupler 24 receives the light transmitted from light source 22 and transmits a portion of the light through an optical fiber cable 26. The light passing through optical fiber cable 26 enters a fiber sensing module 30 attached to an end winding component 46 of an electrical machine such as a generator or a motor. In one embodiment, the generator may comprise a hydrogen cooled generator or an air cooled generator. In the embodiment shown in FIG. 1, fiber sensing module 30 includes a short-period fiber Bragg grating (FBG) 31 as a temperature sensor and a long period grating (LPG) 33 as an oily dirt detection sensor. Also in another embodiment, a plurality of fiber sensing modules 30 may be cascaded and installed at different component locations. The oily dirt may include generator oil, dust and oil mixtures (grease). The oily dirt may further include particles induced from hot-spot burnt polymer particles or particles resulting from worn out winding insulation. In one embodiment, a short-period fiber Bragg grating (FBG) 31 with a typical periodicity of ~0.5 micron, and a long-period grating (LPG) 33 with a typical periodicity of 100-600 microns, are packaged onto a fiberglass plate or any electrically insulated material plate 35 which is then affixed to end winding component 46.

A portion of the light reflected by fiber sensing module 30 is received by a photodetector 32 through optical fiber cable 26. In one embodiment, a wavelength-multiplexing method may be used to interrogate multiple reflected or transmitted signals by each fiber grating's central wavelength. The central wavelength of FBG 31 is its Bragg resonant wavelength which has a linear relationship with generator internal temperature given by:

$$\lambda = 2 \cdot n \cdot \Lambda; \quad (1)$$

$$\Delta\lambda(t) = \kappa \cdot \Delta T \quad (2)$$

where n is effective refractive index of a fiber core (shown in FIG. 2), $\Lambda$ is periodicity, and $\kappa$ is the temperature sensitivity with a value of about 10-12 pm/° C. Similarly for LPG 33, the resonant wavelength is given by $$\lambda = [n_{core} - n_{clad,i}]\Lambda \quad (3)$$

where $n_{core}$ is the effective refractive index of the fiber core and $n_{clad,i}$ is the refractive index of an i-th cladding mode in the fiber cladding, respectively. The relative wavelength shift because of the generator internal temperature variation is given by $$\Delta\lambda = \zeta \cdot \Delta T \quad (4)$$

where $\zeta$ is the temperature sensitivity of LPG 33, and its value is about 50-80 pm/° C. Thus, when the environmental temperature varies, Equation (2) and Equation (4) help in determining the change in the wavelength shift from oily dirt.

The amplitude of the reflected optical signal detected by photodetector 32 depends on the condition of the end winding component 46 or the oily dirt on fiber optic sensing module 30. For example, the refractive index may be different for an oily surface as compared to a non-oily surface. The converted light signal (or "electrical signal") generated by photodetector 32 is transmitted to a data acquisition unit 38. The light source 22 and photodetector 32 may be located within or outside of the generator. In one embodiment, a wireless interface 40 transmits electrical signals to data acquisition unit 38, and data acquisition unit 38 uses the electrical signals to monitor the integrity of generator end winding 34. In another embodiment, an Ethernet cable may be used to transmit electrical signals to data acquisition unit 38, and data acquisition unit 38 uses the electrical signals to analyze the integrity of generator end winding 34. In one embodiment, data acquisition unit 38 detects the presence of oily dirt. In another embodiment, data acquisition unit 38 detects the presence of dynamic strain components on the end winding based on the reflected peak power wavelength of the FBG given by:

$$f = \text{FFT}(\Delta\lambda(t)) \quad (5)$$

where the end-winding fundamental mode at 120 Hz and higher-order modes may be detected simultaneously.

Figure 2:
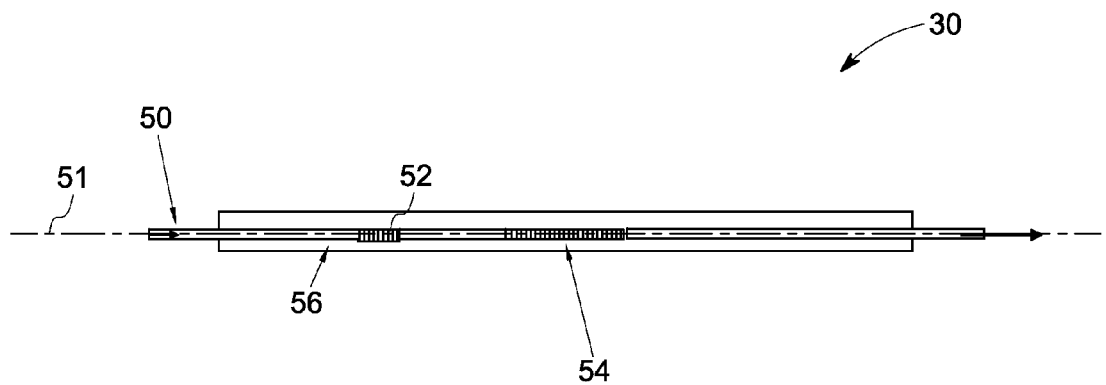
FIG. 2 is a schematic diagram of a fiber grating based sensing module, in accordance with an embodiment of the invention.

FIG. 2 shows a fiber grating based sensing module 30 in accordance with an embodiment of the present invention. Sensing module 30 includes a central fiber core 50, a short-period fiber Bragg grating (FBG) 52, a long period grating (LPG) 54 and a fiber cladding 56. In one embodiment, central fiber core 50 comprises germanium dioxide (GeO2) or fluorine (F) co-doped silica and has a diameter ranging from about 5 microns to about 9 microns. In addition, a polyimide coating-layer of 10 to 20 microns thick may be used for protecting the grating area. FBG 52 may be used for determining the baseline temperature of the generator internal component and also variations in real time and thereby may be used to correct sensor baseline variation. The FBG has a narrow bandwidth of ~0.3 nm, and a LPG has a 10-20 nm transmission dip. In one embodiment, each sensing module is designed by inscribing a 15 mm length LPG and a 5 mm length FBG with 10 mm separation between them. The LPG structure 54 has a modulation along a longitudinal axis 51 with a pitch size of about 100 microns to about 600 microns. The LPG structure 54 is configured to effectively shed fundamental mode energy to the modes of the fiber cladding 56 with an apodized or a blazed refractive index modulation profile. In one embodiment, the forwarded guided wave propagates and partial energy is coupled into fiber cladding 56 or external surrounding medium when the refractive index surrounding medium is different from that of fiber cladding. Fiber cladding 56 is circumferentially disposed about fiber core 50 and, in one embodiment, includes pure silica or fluorine doped silica with an outer diameter of about 125 microns.

Figure 3:
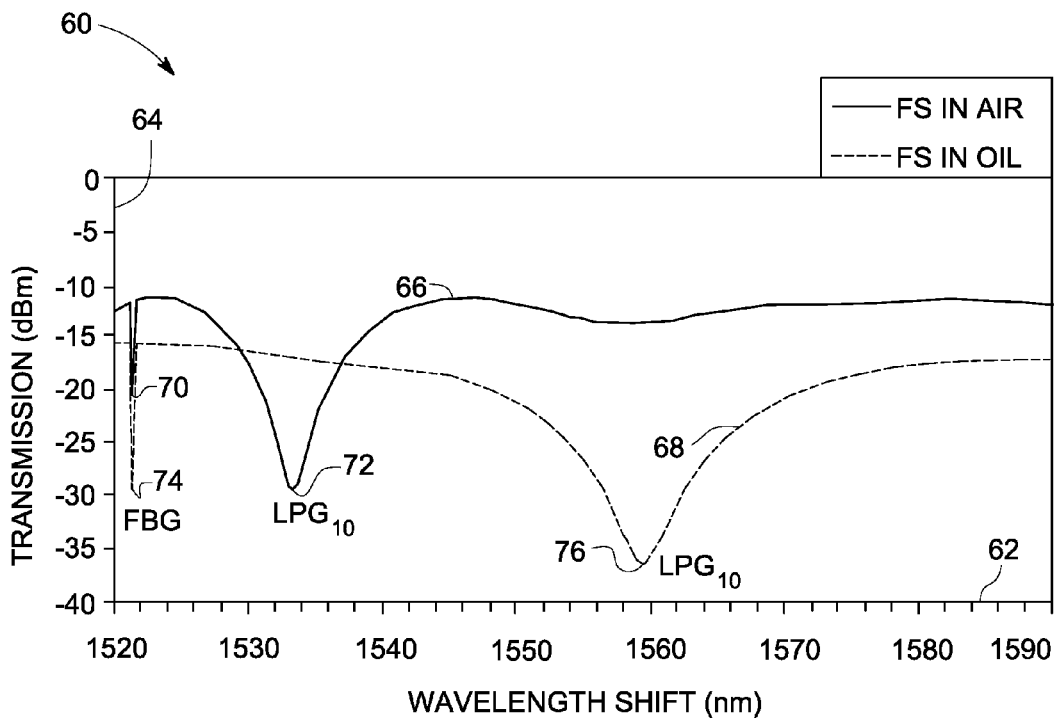
FIG. 3 is a graphical representation of transmission variation with respect to wavelength shift of a fiber grating based sensing module in accordance with an embodiment of the present invention.

FIG. 3 shows a graph 60 of a transmission response of the fiber optic sensing module of FIG. 1 with respect to wavelength shift. Horizontal axis 62 represents wavelength shift in nanometers, whereas vertical axis 64 represents transmission response amplitude in decibel milliwatts (dBm). Plot 66 is for the transmission response of the fiber optic sensor in air, and plot 68 is for the transmission response of the fiber optic sensor in generator oil. Both plots 66 and 68 have two dips in their responses 70, 72 for plot 66 and 74, 76 for plot 68 owing to the FBG and the LPG structure respectively. Since the refractive index of the fiber cladding is approximately close to 1.46 and the refractive index of the generator oil is about 1.6, the LPG transmission spectrum shifts dramatically while the FBG transmission spectrum has no shift at all because of the FBG's insensitivity to external refractive index variation.

Figure 4:
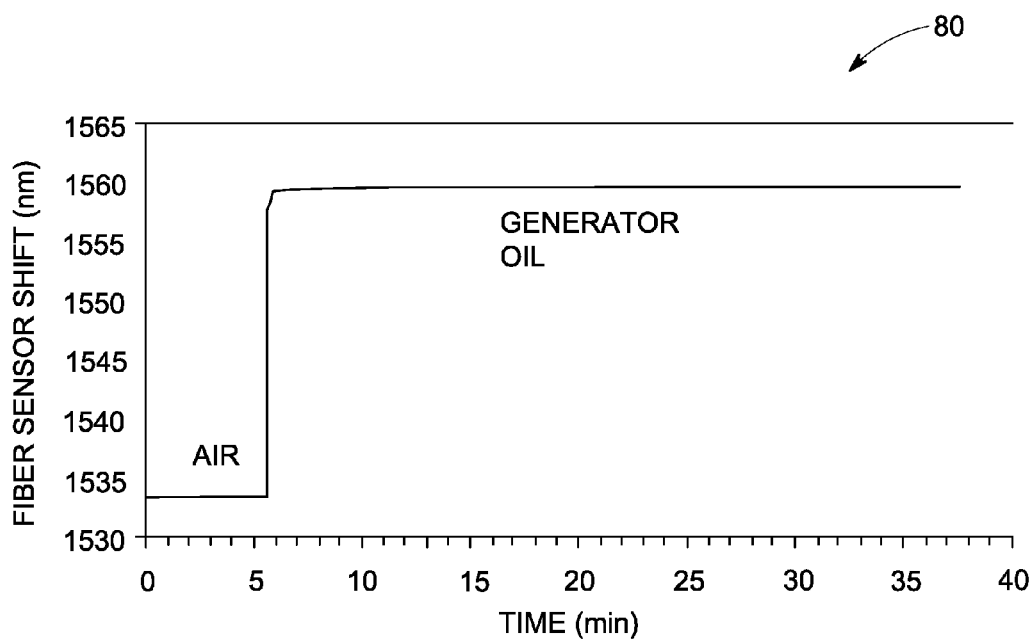
FIG. 4 is a graphical representation of a wavelength shift of a fiber grating-based sensing module in accordance with an embodiment of the present invention.

FIG. 4 shows a plot 80 of a wavelength shift of the fiber optic sensing module attached to the end winding component in accordance with an embodiment of the present invention. Plot 80 is for a fiber optic sensing module 30 described in FIG. 1. It can be seen from plot 80 that as an end winding integrity monitoring sensor, the sensor response wavelength shift amplitude increases to about 1560 nm from about 1534 nm. The central wavelength of the LPG sensor is located at 1534 nm when its surface is surrounded by air whereas the central wavelength of the LPG is shifted to 1560 nm which indicates the presence of generator oil on the generator end winding component. Thus, the generator oil induces a wavelength up shift of about 26 nm due to its high refractive index than that of the fiber cladding. On the contrary, a lower refractive index of a fluid or oil could induce a downshift of the fiber sensor. With this wavelength shift response, it is possible to provide sufficient sensitivity to quantitatively analyze oil mists, and time-dependent grease formation and accumulation.

Figure 5:
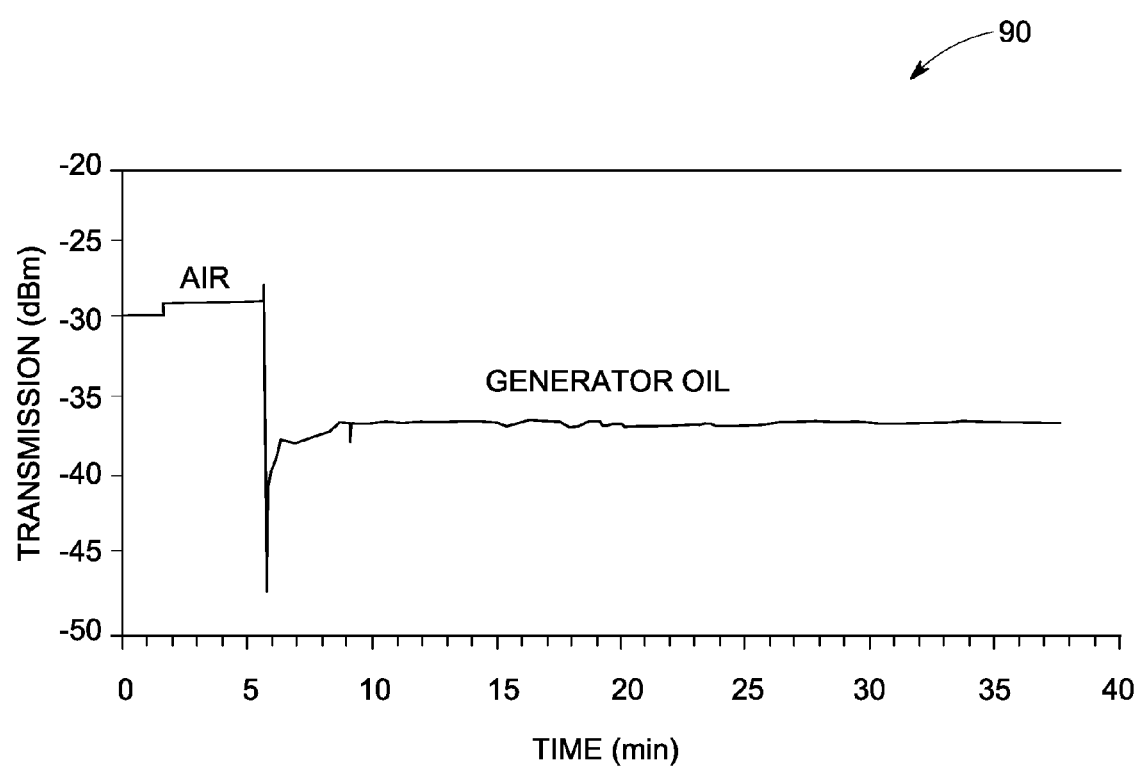
FIG. 5 is a graphical representation of a transmission loss change measured from a fiber grating-based sensing module.

FIG. 5 shows a plot 90 of a transmission amplitude of the fiber optic sensing module attached to the end winding component. It can be seen from plot 90 that the transmission amplitude decreases to about −36 dBm from about −29 dBm. The lost transmission amplitude of ~7 dBm indicates the presence of higher refractive index fluid or aqueous substance such as air around the generator end winding component. Thus, fiber sensor transmission response is about 7 dBm from air to generator oil when fiber cladding surrounding medium refractive index changes from n~1 (air) to n~1.6 (oil). By combing both wavelength shift and transmission loss, accurate determination of the oil, grease, and aqueous mixtures from other particles and oil can be made. Furthermore, the reflection peak wavelength of the FBG can be used for end-winding dynamic strain analysis by its Fast Fourier Transform as described in Eq. (6).

Figure 6:
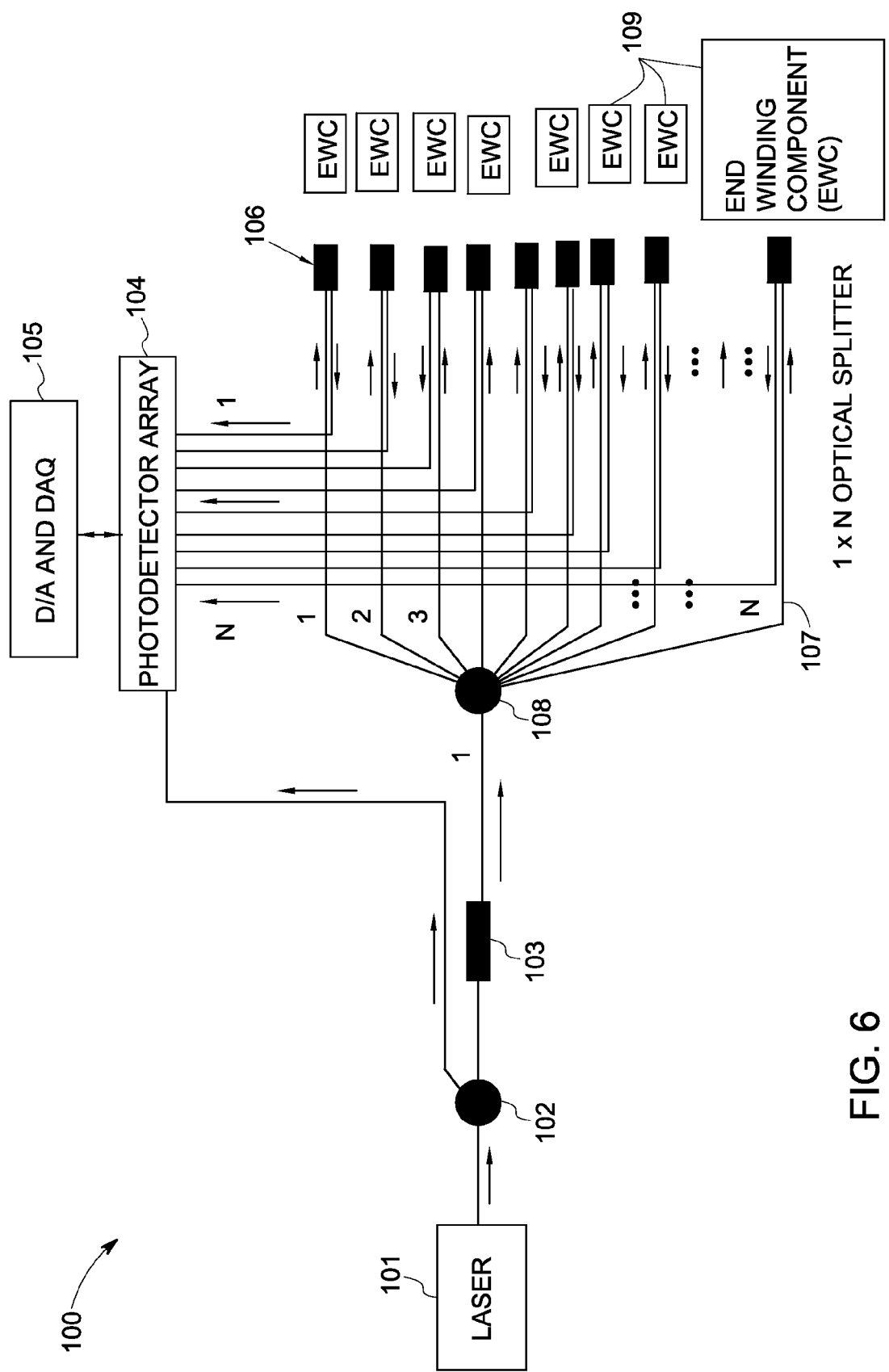
FIG. 6 is a schematic view of another fiber optic based end winding integrity monitoring system in accordance with an embodiment of the present invention.

FIG. 6 illustrates another fiber optic reflectance based end winding component monitoring system 100 in accordance with an embodiment of the present invention. The scheme 100 includes a laser source 101, a first optical splitter 102, an optical coupler 103, and a photodetector array 104. The system further includes multiple fiber optic cables 107 for passing the light through a plurality of fiber sensing probes 106 to multiple points on an end winding component 109. System 100 also includes a processing circuitry 105 having a digital to analog converter and a data acquisition module. In one embodiment, for a single fiber optic cable, a direct light coupling from the laser source 101 to a fiber bundle can be realized by using FC/UPC or SMA 905 connectors. Light from one light source can be split into multiple fibers 107 for illuminating multiple points on end winding component 109 using a second optical splitter 108. The first optical splitter 102 splits the light signal from the laser source into two signals with one signal as a reference signal to the photodetector array 104 and another signal to the second optical splitter 108 through the optical coupler 103. In one embodiment, a time division multiplexing, a wavelength-multiplexing, or optical switching method may be used to interrogate multiple reflected signals. In another embodiment, the split ratio of two light beams ranges from 1/99 to 5/95. The second optical splitter 108 is of length 1×N, where N is number of sensor probes. The second optical splitter equally splits the light signal into N split light signals, and each split light is sent to each fiber sensing probe with each reflected signal from end winding component 109 then being sent back to the photodetector array 104. The converted light signal (or "electrical signal") generated by photodetector 104 is transmitted to processing circuitry 105. The electrical signals are converted into digital signals with a reference signal from the first optical splitter for suppressing drifting and light source degradation.

In one embodiment, processing circuitry 105 detects the presence of oily as well as non oily dirt such as dust, oil and grease and also the presence of motion on the end winding component by comparing the electrical signal values with dynamic displacement data stored into the memory of the processing circuitry 105. The end winding integrity at multiple points can be monitored either simultaneously or individually. In another embodiment, the fiber sensing probes 106 are sensitive to dirt or are functionalized for identifying dust, generator oil, dust and oil mixtures (grease) and for being insensitive to temperature, pressure, and hydrogen cooling gas flow variation. In one embodiment, fiber sensing probes 106 are functionalized by being fabricated with a chemically sensitive surface so that, when a refractive index of an external medium changes, the light radiation modulates the reflectance amplitude accordingly.

A table may be constructed to indicate that, for a given condition and distance of cable from the component 109, a given amplitude of the electrical signal is expected. For example, in one embodiment based on the functionalization of the fiber sensing probe and the distance between the cable and the end winding component, if the electrical signal amplitude is 3.8V it may indicate presence of the oil, whereas if the electrical signal amplitude is 4 V then it indicates presence of air. The stored data is obtained from calibration experiments of the electrical signal performed in advance of real time operation with known dirt conditions. Processing circuitry 105 then displays presence of dirt-related parameters during real time operation. In another embodiment, simply a plot of electrical signal is displayed and then the presence of dirt is identified manually from the amplitudes of the electrical signals. When there is no dirt, the reflectance remains constant, whereas the reflectance will decrease or increase depending upon the changes in external medium refractive index. Motion detection may be realized by obtaining data from an area of the end winding section where integrity needs to be monitored as described in more detail below with respect to FIGS. 11 and 12.

Figure 7:
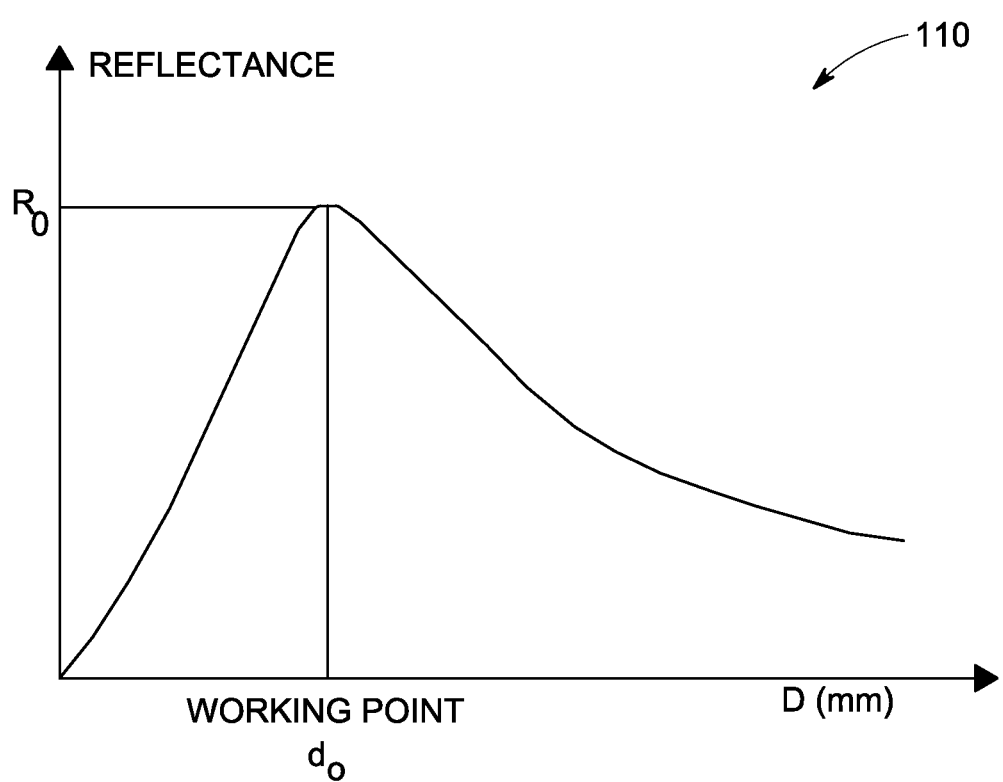
FIG. 7 is a plot of variation of reflected signal amplitude versus standoff distance of the fiber sensing probe from the end winding component.

FIG. 7 shows a plot 110 of variation of reflected signal amplitude (vertical axis) with respect to the distance D between the probe tip and the end winding component (horizontal axis). When monitoring end winding component motion, it is useful to position the fiber sensing probe at a distance from the end winding component (the "standoff distance") at a displacement insensitive position. A maximum reflected signal amplitude $R_o$ occurs at a certain standoff distance of $d_o$, which is defined as a "working point" distance. It can be seen from the plot that the signal amplitude can be changed by choosing a different standoff distance. At the maximum signal amplitude, the signal has no sensitivity to small distance variation, and any signal change can be attributed to sensing material reflectivity or absorption changes. Thus, in one embodiment, fiber sensing probes 106 are set up at a standoff distance from the generator end winding that is equal to the working point distance to receive light scattering signals from end winding component 109 for determining the presence of dirt.

Figure 8:
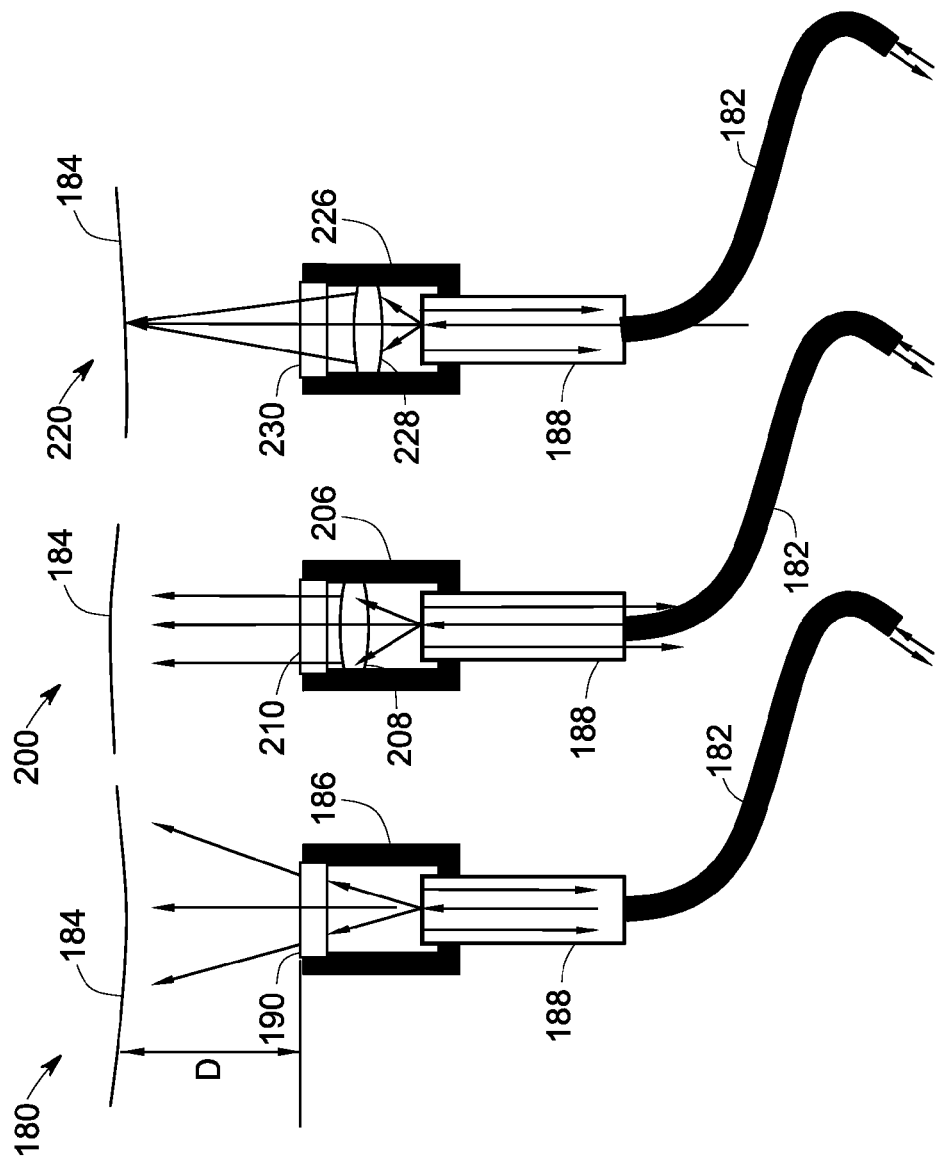
FIG. 8 is a schematic representation of three fiber optic probe structures in accordance with an embodiment of the present invention.

FIG. 8 shows three different types of fiber sensing probes 180, 200, and 220 that may be used to monitor an end-winding component in accordance with embodiments of the present invention. Each of the fiber sensing probes 180, 200, and 220 includes a fiber optic cable 182 to transmit and receive light signals to and from an end-winding component 184 and a probe house 186, 206, and 226 respectively. The reflected light signals are then analyzed to determine presence of dirt or motion on end winding component 184. A pressure sealing feedthrough 188 may be utilized to maintain a proper sealing of probe house 186, 206 and 226 with fiber optic cable 182. All of the probe houses 186, 206, and 226 include a transparent window 190, 210 and 230 which are positioned at a standoff distance from the component to be measured; and the probe houses 206 and 226 include lenses 208 and 228 respectively. Fiber sensing probe 180 has no lens inside the probe house 186. The output of the fiber probe 180 is a divergent beam that is mainly used to measure dirt that deposits on the window surface 190 which is indicative of dirt which is also being deposited on the component to be measured. Depending upon the reflective and optical properties, the detected reflectance may be used to identify oil, oil and dust mixtures, or dust in the central area on the window surface. In this case, the fiber probe is provided with an appropriate support structure and installed near a location that is mostly likely to accumulate dusts, grease, or particles.

Optical lens 208 in sensing probe 200 outputs a collimated beam, which is used to monitor a certain area of an end-winding component surface. One benefit of the collimated beam is that sensing probe 200 may be positioned at a longer distance away from surface 184. Optical lens 228 in sensing probe 220 outputs a focused beam on a generator component surface and is mainly used for end-winding loosening and motion detection. It is also possible to set the convex-plato optical lens at the working point distance for both dirt and motion detection. In one embodiment, the standoff distance D may be determined by evaluating signal-to-noise ratios from the end-winding component surface. In one embodiment, the standoff distance range may be from 0.1 meter to 0.5 meter, for example. The standoff distance D in probe 220 is determined by the focus length of the optical lens, which is more sensitive to dynamic displacement or motion. In another embodiment, the standoff distance for the focused beam type probe is less than the standoff distance for the collimated probes. In a more specific embodiment, the distance between the optical lens of the focused beam type probe and the component to be measured is one half of the working point distance, or $d_o/2$. The housing of the fiber sensing probes is shown for purposes of example. In some embodiments, fiber sensing probes 180, 200, and 220 may be used with different types of packaging.

In the embodiment of FIG. 8, fiber optic cable 182 may comprise a plurality of optical fibers for light incidence and light reflectance that are surrounded by a support structure or a dielectric material ferrule. In one embodiment, the dielectric material ferrule comprises a plastic ferrule, a silicon monocoil, or a polyvinyl chloride (PVC) monocoil. A commonly used fiber cable coaxial probe configuration has one central fiber for laser delivery, and six fibers surrounding the central fiber for reflective light pickup. In another H probe configuration, incident fibers occupy half of the probe space, and receiving fibers occupy another half of the probe space. Fiber sensing probes 180, 200 and 220 may be functionalized by using chemically sensitive window glass for identifying dirt such as dust, oil, and dust and oil mixtures (grease) and for being insensitive to temperature, pressure, and hydrogen cooling gas flow. In one embodiment, the incident light source may include a RGB laser which can emit 471 nm, 532 nm, and 671 nm laser beams alternatively or simultaneously. The differentiation of reflection signals from these wavelengths can then be used to identify dirt such as dust, oil, and dust and oil mixtures (grease). In another embodiment, the light source includes a single-frequency light source or multi-wavelength broadband light source.

Figure 9:
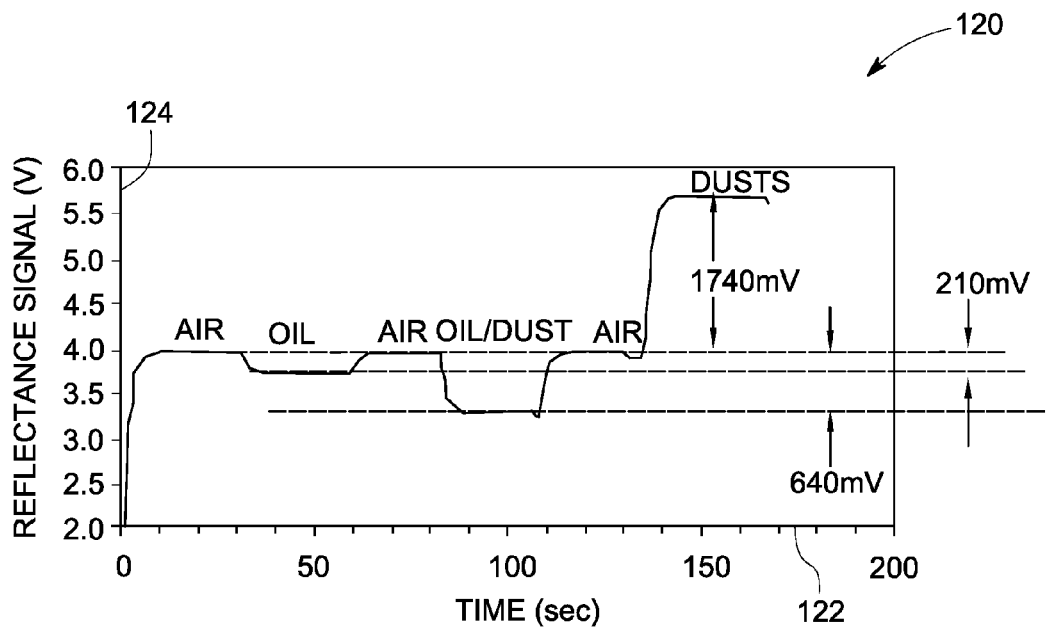
FIG. 9 is a graphical representation of a reflectance signal from different media in accordance with an embodiment of the present invention.

FIG. 9 shows a plot 120 of fiber optic probe responses for oil, dust, and oil/dust mixtures on an end-winding component. The horizontal axis 122 represents a measurement sequence according to time, and the vertical axis 124 represents reflectance or the electrical signal from the photodetector signal in volts. As described earlier, values for use in evaluating the electrical signal may be obtained experimentally in advance to determine the presence of dirt. The end winding component on which the presence of dirt is to be measured contained clean window surface at first. Thus, plot 120 shows reflectance signal of around 4 V which indicates that there is no dirt as the baseline. When generator oil drops are provided onto the window surface, the reflectance signal amplitude decreases to about 3.79 V which indicates the presence of oil on the end winding. The signal loss can be attributed to the diffused scattering by oil. Similarly, when dust is further applied to the window surface, the reflectance signal amplitude drops to 3.54 V which indicates presence of a mixture of oil and dust. At around 140 seconds, the reflectance signal amplitude jumps to 5.740 V which indicates presence of significant dust on the end winding. Thus, it can be seen that the reflectance signal shows significant difference from dusts, oil, and, oil/dust mixtures. The data shown in plot 120 was taken at a same spot by varying various dirt conditions manually. It should be noted that the signal amplitude here is relative, and a normalization can be used for optical reflectance measurement. A normalized signal could be calibrated with generator oil, oil mist, dust, and grease, for example.

Figure 10:
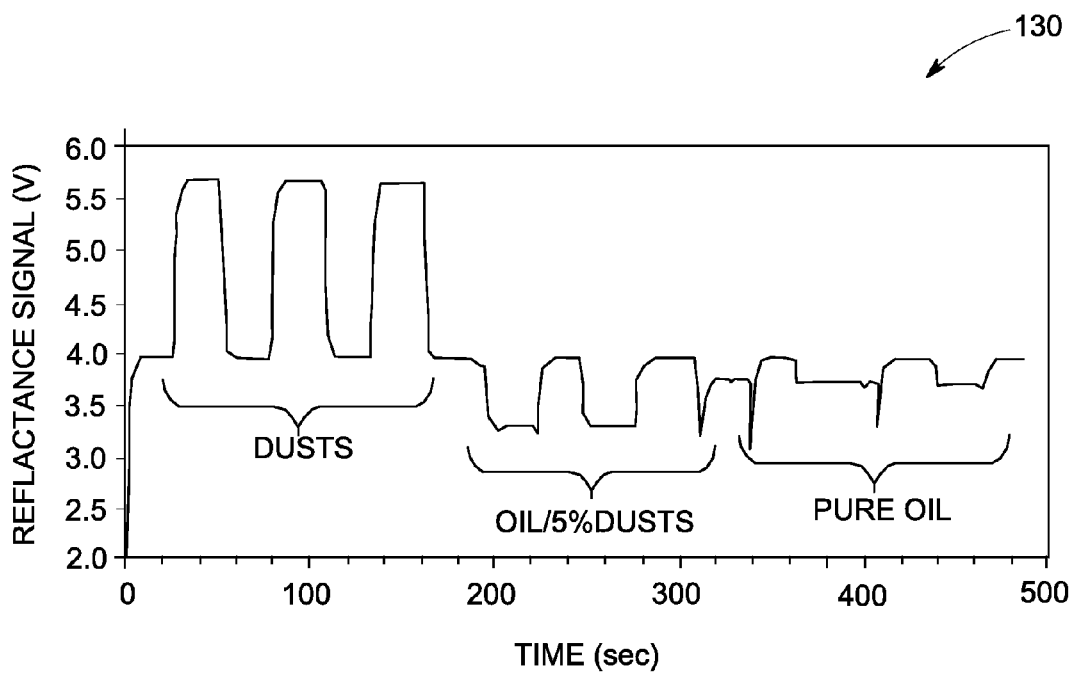
FIG. 10 is a graphical representation of a repeated reflectance signal from different media in accordance with an embodiment of the present invention.

FIG. 10 shows a plot 130 of repeated reflectance signal of a fiber sensing probe from different media such as oil, oil mist, dust, and oil/dust mixtures. It can be seen from plot 130 that even with repeated cycles of dusts and air or oil and air or even air and oil/dust mixture, the fiber sensing probe responds fast and also accurately.

Figure 11:
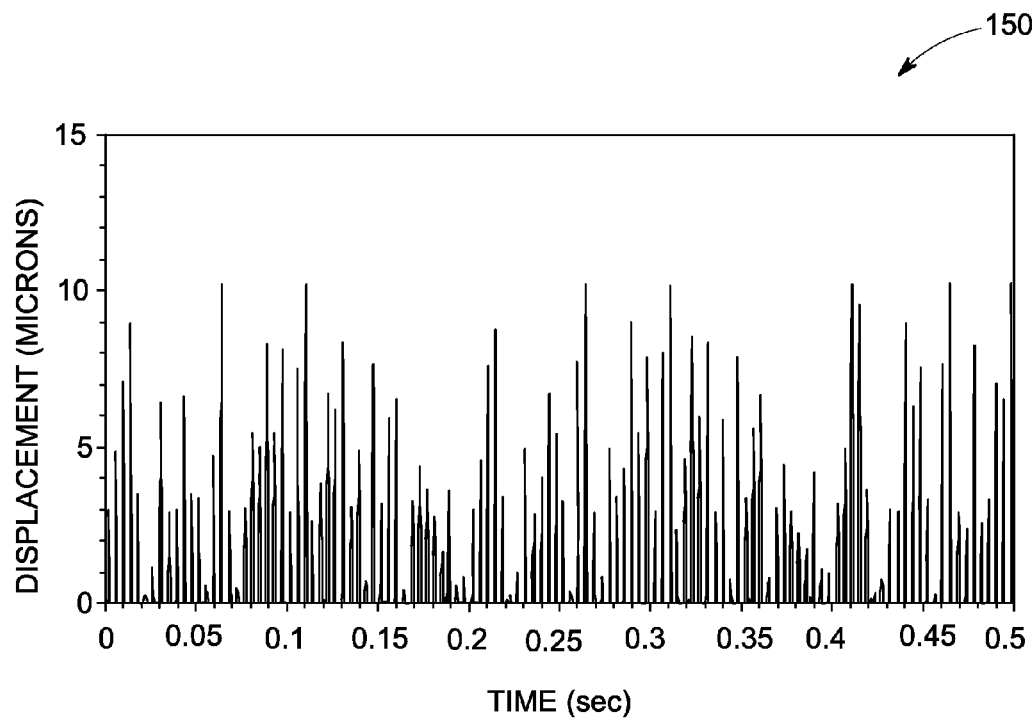
FIG. 11 is a graphical representation of typical displacement from a moving surface.

FIG. 11 shows a measured dynamic displacement data 150 from a moving surface which has a typical displacement of 10 microns. When there is motion in the end-winding component, the reflectance signal will have an AC component, and, as discussed above, an FFT of the reflectance signal may be conducted to determine the presence of motion. The dynamic displacement data 150 is representative of actual motion in terms of microns from an area of the end winding section where integrity needs to be monitored. The small displacement signal from the end winding section adds an "AC" component to the reflected "DC" electrical signal. The end winding dynamic behavior is then calculated by taking fast Fourier transform (FFT) of the electrical signal. Alternatively, the peak-to-peak dynamic displacement can be calculated as the difference between the maximum and minimum of a portion of the time waveform. The calculated winding motion can be further correlated with a loosening condition of the generator end winding.

Figure 12:
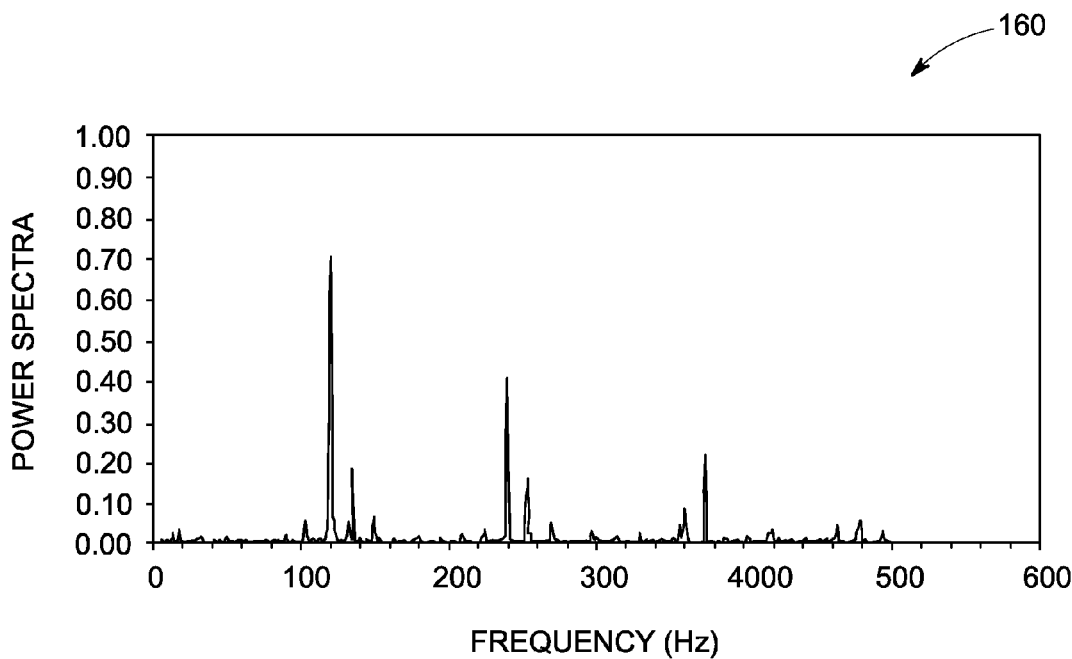
FIG. 12 is a frequency response representation of dynamic response to a moving surface in accordance with an embodiment of the present invention.

FIG. 12 shows a FFT plot 160 of the electrical signal. Plot 160 shows frequency components determined from FFT of the electrical signal with 120 Hz as first movement mode, and several higher-order modes up to 500 Hz can also be clearly seen (and are typically present in generator environments). In this motion detection example, as described earlier, the fiber sensing probe used for motion sensing analysis may be positioned at half of the working point distance.

One of the advantages of the described monitoring systems is that the integrity of the end windings in an electrical machine such as generator or a motor can be determined by simultaneously monitoring oil, dusts, grease, and motion with one fiber optic sensing system. Another advantage of the system is it enables integrity monitoring that is insensitive to hydrogen gas, pressure, temperature, and flow variation. Yet another advantage of the monitoring system is that it can be placed inside the generator pressure vessel or outside. Also, even though the embodiments disclosed herein describe generator end winding, the embodiments of the present invention may be used for monitoring any other electrical machine component. In certain embodiments, depending upon the application, the fiber sensing probe may be made from metal or ceramic material. The probe house window plate can be used as a diaphragm for dynamic pressure detection. Furthermore, a chemical active layer on the window plate may be used for moisture, toxic gas and corrosion detections.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electrical machine component monitoring system comprising:
    a light source for providing an optical signal through a fiber optic cable;
    a fiber optic sensing component positioned on the electrical machine component or at a standoff distance from the electrical machine component for producing a reflected optical signal representative of a condition of the electrical machine component;
    a photodetector for receiving the reflected optical signal from the fiber optic sensing component and converting the reflected optical signal to an electrical signal; and
    processing circuitry configured to determine information regarding dirt on the electrical machine component by analyzing the electrical signal.

2. The monitoring system of claim 1, wherein the processing circuitry is configured to further determine information regarding motion of the electrical machine component by analyzing the electrical signal.

3. The monitoring system of claim 1, wherein the processing circuitry determines information regarding dirt on the electrical machine component based on a transmission loss amplitude and a central wavelength shift of the fiber optic sensing component.

4. The monitoring system of claim 1, wherein the dirt comprises dust, oil, grease, particles induced from hot-spot burnt polymer particles, particles resulting from worn out winding insulation, or combinations thereof.

5. The monitoring system of claim 1, wherein the electrical machine component comprises a generator end winding component.

6. The monitoring system of claim 1, wherein when the fiber optic sensing component is positioned on the electrical machine component and the fiber optic sensing component comprises a long-period grating structure and is responsive to changes in the refractive index of a surrounding medium.

7. The monitoring system of claim 6, wherein the fiber optic sensing component further comprises a short-period Bragg grating structure for providing a signal useful in determining a baseline temperature and variations in the baseline temperature of the fiber optic sensing component.

8. The monitoring system of claim 7, wherein the fiber grating structures comprise a fiber cladding circumferentially disposed about a central fiber core.

9. The monitoring system of claim 7, wherein the fiber grating structures are packaged with a fiberglass plate or electrically insulated material and attached to the electrical machine component.

10. The monitoring system of claim 1, wherein when the fiber optic sensing component is positioned at a standoff distance from electrical machine component and the fiber optic sensing component is sensitive to dirt.

11. The monitoring system of claim 10, wherein the fiber optic sensing component is insensitive to temperature, pressure, and hydrogen cooling gas flow variation.

12. The monitoring system of claim 10, wherein the standoff distance comprises a working point distance from the electrical machine component for determining information regarding dirt.

13. The monitoring system of claim 10, wherein the fiber optic sensing component that is sensitive to dirt comprises a first fiber optic sensing component located at a first standoff distance.

14. The monitoring system of claim 10, further comprising a second fiber optic sensing component sensitive to motion, wherein the second fiber optic sensing component comprises an optical lens located at a distance from the electrical machine component that is less than that of the first standoff distance.

15. The monitoring system of claim 14, wherein the processing circuitry determines information regarding the motion by obtaining a fast Fourier transform (FFT) of the reflected optical signal from the second fiber optic sensing component.

16. The monitoring system of claim 14, wherein the processing circuitry determines information regarding motion by calculating the difference between the maximum and minimum distance in an optical signal time response waveform.

17. The monitoring system of claim 10, wherein the processing circuitry determines information regarding the dirt based on a comparison of the electrical signals with previously obtained electrical signals obtained under calibrated conditions.

18. The monitoring system of claim 10, wherein the fiber optic sensing component comprises a fiber probe housing including an optical lens and a transparent window glass.

19. The monitoring system of claim 10, wherein the fiber optic sensing component comprises a dielectric material ferrule comprising a plastic ferrule, a silicon monocoil or a polyvinyl chloride (PVC) monocoil.

20. The monitoring system of claim 10, wherein the light source comprises a single-frequency light source, RBG laser, or multi-wavelength broadband light source.

21. The monitoring system of claim 10, wherein the fiber optic cable comprises a plurality of fiber optic cables for carrying the initial optical signal from an optical splitter to a plurality of positions on the electrical machine component and for carrying reflected optical signals from the plurality of positions on the electrical machine component to a photodetector array, wherein the photodetector array comprises a plurality of photodetectors and is configured to convert the reflected optical signals to electrical signals.

22. A method for an electrical machine component monitoring comprising:
    providing an optical signal onto the electrical machine;
    measuring a reflected optical signal from a fiber optic sensing component positioned on the electrical machine component or at a standoff distance from the electrical machine component; and
    determining information regarding dirt on the electrical machine component by analyzing the reflected optical signal.

23. The method of claim 22 further comprising determining information regarding motion of the electrical machine component by analyzing the reflected optical signal.

* * * * *